(12) United States Patent
Chang et al.

(10) Patent No.: US 6,346,476 B1
(45) Date of Patent: Feb. 12, 2002

(54) METHOD FOR ENHANCING LINE-TO-LINE CAPACITANCE UNIFORMITY OF PLASMA ENHANCED CHEMICAL VAPOR DEPOSITED (PECVD) INTER-METAL DIELECTRIC (IMD) LAYERS

(75) Inventors: Weng Chang, Taipei; Syun-Ming Jang, Hsin-Chu, both of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/405,057

(22) Filed: Sep. 27, 1999

(51) Int. Cl.[7] .............................................. H01L 21/44
(52) U.S. Cl. ...................................... 438/680; 438/597
(58) Field of Search ................................ 438/597, 624, 438/680, 784, 763; 257/642

(56) References Cited

U.S. PATENT DOCUMENTS

| | | | |
|---|---|---|---|
| 5,621,241 A | 4/1997 | Jain | 257/632 |
| 5,661,093 A | 8/1997 | Ravi et al. | 438/763 |
| 5,759,906 A | 6/1998 | Lou | 438/623 |
| 5,800,621 A | 9/1998 | Redeker et al. | 118/723 |
| 5,937,323 A * | 8/1999 | Orczyk et al. | 438/624 |
| 6,072,227 A * | 6/2000 | Yau et al. | 257/642 |
| 6,077,764 A * | 6/2000 | Sugiarto et al. | 438/597 |

* cited by examiner

Primary Examiner—David Nelms
Assistant Examiner—David Vu
(74) Attorney, Agent, or Firm—George O. Saile; Stephen B. Ackerman; Stephen G. Stanton

(57) ABSTRACT

A method for forming a dielectric layer. There is first provided a substrate. There is then formed over the substrate a patterned conductor layer. There is then formed upon the patterned conductor layer, while employing a plasma enhanced chemical vapor deposition (PECVD) method, a silicon containing dielectric layer, wherein when forming the silicon containing dielectric layer there is controlled a temperature of the substrate so that there is enhanced a line-to-line capacitance uniformity of the patterned conductor layer.

25 Claims, 2 Drawing Sheets

METHOD FOR ENHANCING LINE-TO-LINE CAPACITANCE UNIFORMITY OF PLASMA ENHANCED CHEMICAL VAPOR DEPOSITED (PECVD) INTER-METAL DIELECTRIC (IMD) LAYERS

BACKGROUND OF THE INVENTION

1. Field of the Invention

The present invention relates generally to methods for forming inter-metal dielectric (IMD) layers within microelectronic fabrications. More particularly, the present invention relates to methods for forming with enhanced line-to-line capacitance uniformity inter-metal dielectric (IMD) layers within microelectronics fabrications.

2. Description of the Related Art

Microelectronic fabrications are formed from microelectronic substrates over which are formed patterned microelectronic conductor layers which are separated by microelectronic dielectric layers.

As microelectronic fabrication integration levels have increased and microelectronic device and patterned microelectronic conductor layer dimensions have decreased, it has become increasingly more important within the art of microelectronic fabrication to form interposed between the patterns of patterned microelectronic conductor layers within microelectronic fabrications microelectronic dielectric layers formed of low dielectric constant dielectric materials. Low dielectric constant dielectric materials are desirable for forming microelectronic dielectric layers formed interposed between the patterns of patterned microelectronic conductor layers within microelectronic fabrications since such low dielectric constant dielectric materials provide, among other features, microelectronic fabrications with enhanced microelectronic fabrication speed and reduced patterned microelectronic conductor layer cross-talk.

For the purposes of the present disclosure, low dielectric constant dielectric materials are intended as dielectric materials having a dielectric constant (relative to vacuum) of preferably less than about 3.8, and more preferably from about 2.0 to about 3.8. For comparison purposes, conventional dielectric materials which are typically employed within microelectronic fabrications, such conventional dielectric materials including but not limited to silicon oxide dielectric materials, silicon nitride dielectric materials and silicon oxynitride dielectric materials, typically have dielectric constants in the range of from about 4.0 to about 8.0.

Of the low dielectric constant dielectric materials which may be employed for forming low dielectric constant dielectric layers within microelectronic fabrications, fluorosilicate glass (FSG) low dielectric constant dielectric materials have recently received considerable interest and attention. Within the context of the present application, fluorosilicate glass (FSG) low dielectric constant dielectric materials are intended as non-stoichiometric silicon oxide dielectric materials which have incorporated therein a fluorine dopant at a concentration of from about 2 to about 10 or atom percent. Such fluorosilicate glass (FSG) low dielectric constant dielectric materials typically have a dielectric constant of from about 3.3 to about 3.8. Fluorosilicate glass (FSG) low dielectric constant dielectric materials are generally of considerable interest insofar as they may under certain circumstances be formed by employing comparatively minor modifications of methods which are conventionally employed for forming silicon oxide dielectric materials within microelectronic fabrications.

While low dielectric constant dielectric layers formed of fluorosilicate glass (FSG) low dielectric constant dielectric materials are thus desirable within the art of microelectronic fabrication, low dielectric constant dielectric layers formed of fluorosilicate glass (FSG) low dielectric constant dielectric materials are nonetheless not entirely without problems within the art of microelectronic fabrication. In particular, it is known in the art of microelectronic fabrication that low dielectric constant dielectric layers formed of fluorosilicate glass (FSG) low dielectric constant dielectric materials are often chemically unstable incident to the incorporation therein of loosely bound mobile fluorine atoms. Similarly, it has also been observed that it is often difficult to form low dielectric constant dielectric layers from fluorosilicate glass (FSG) low dielectric constant dielectric materials with optimally uniform electrical properties, such as but not limited to line-to-line capacitance.

It is thus towards the goal of forming within a microelectronics fabrication a low dielectric constant dielectric layer formed of a fluorosilicate glass (FSG) low dielectric constant dielectric material, with uniform electrical properties, that the present invention is more particularly directed. In a more general sense the present invention is also directed towards the goal of forming within a microelectronic fabrication a silicon containing dielectric layer, which need not necessarily be formed of a fluorosilicate glass (FSG) low dielectric constant dielectric material, with uniform electrical properties.

Various methods and apparatus have been disclosed within the art of microelectronic fabrication for forming dielectric layers, such as low dielectric constant dielectric layers formed of fluorosilicate glass (FSG) low dielectric constant dielectric materials, with desirable properties within microelectronic fabrications.

For example, Jain, in U.S. Pat. No. 5,621,241, discloses a semiconductor integrated circuit microelectronics fabrication, and a method for forming the semiconductor integrated circuit microelectronic fabrication, where a dielectric layer employed for separating a series of patterns within a patterned conductor layer within the semiconductor integrated circuit microelectronic fabrication is formed with improved fabrication throughput, improved gap-fill planarity and improved within-wafer uniformity. To realize the foregoing objects, the method employs a gap-fill dielectric layer formed upon the patterned conductor layer while employing a high density plasma chemical vapor deposition (HDP-CVD) method, where the gap-fill dielectric layer has formed thereupon a sacrificial dielectric polish layer which has an enhanced chemical mechanical polish (CMP) rate with respect to the gap-fill dielectric layer.

In addition, Ravi et al., in U.S. Pat. No. 5,661,093, discloses a method and apparatus for forming within a microelectronics fabrication a halogen doped silicon oxide dielectric layer with enhanced resistance to moisture absorption and outgassing. To realize the foregoing objects, the method employs when forming the halogen doped silicon oxide layer a multiplicity of carbon rich sealing layers or undoped silicon oxide sealing layers interposed between a series of halogen doped silicon oxide dielectric sub-layers which comprise the halogen doped silicon oxide dielectric layer.

Further, Lou, in U.S. Pat. No. 5,759,906, discloses a method for forming within a microelectronic fabrication a planarized inter-metal dielectric (IMD) layer comprising a low dielectric constant dielectric material comprising a spin-on-glass (SOG) dielectric material or a spin-on-polymer (SOP) dielectric material: (1) without directly planarizing the low dielectric constant dielectric material, and (2) while not exposing within a via formed through the planarized inter-metal dielectric (IMD) layer the low dielectric constant dielectric material comprising the spin-on-glass (SOG) dielectric material or the spin-on-polymer (SOP) dielectric material. To realize the foregoing objects, there is first employed when forming the planarized inter-metal dielectric (IMD) layer a dielectric capping layer (which may be formed of a fluorosilicate glass (FSG) low dielectric constant dielectric material) where the dielectric capping layer is partially chemical mechanical polish (CMP) planarized without planarizing the low dielectric constant dielectric material comprising the spin-on-glass (SOG) dielectric material or the spin-on-polymer (SOP) dielectric material. There is then also formed an annular dielectric spacer layer (which also may be formed of a fluorosilicate glass (FSG) low dielectric constant dielectric material) into a via formed through the partially chemical mechanical polish (CMP) planarized dielectric capping layer and the underlying low dielectric constant dielectric material.

Finally, Redeker et al., in U.S. Pat. No. 5,800,621, discloses a plasma apparatus which provides a more uniform plasma in a location directly over a substrate which may be fabricated employing the plasma apparatus and thus presumably also inherently provides over the substrate a more uniform dielectric layer formed over the substrate when the plasma apparatus is employed within a plasma enhanced chemical vapor deposition (PECVD) method for forming the dielectric layer over the substrate. To realize the foregoing objects, the plasma apparatus employs a specific geometric disposition of a top plasma antenna, a side plasma antenna and a gas inlet within the plasma apparatus.

Desirable in the art of microelectronic fabrication are additional methods and materials which may be employed for forming dielectric layers, such as but not limited to low dielectric constant dielectric layers formed of fluorosilicate glass (FSG) low dielectric constant dielectric materials, with enhanced uniformity of electrical properties.

It is towards the foregoing object that the present invention is both generally and more specifically directed.

SUMMARY OF THE INVENTION

A first object of the present invention is to provide a method for forming within a microelectronic fabrication a dielectric layer with enhanced uniformity of electrical properties.

A second object of the present invention is to provide a method in accord with the first object of the present invention, where the dielectric layer is a low dielectric constant dielectric layer formed employing a fluorosilicate glass (FSG) low dielectric constant dielectric material.

A third object of the present invention is to provide a method in accord with the first object of the present invention or the second object of the present invention, which method is readily commercially implemented.

In accord with the objects of the present invention, there is provided by the present invention a method for forming a dielectric layer. To practice the method of the present invention, there is first provided a substrate. There is then formed over the substrate a patterned conductor layer. There is then formed upon the patterned conductor layer, while employing a plasma enhanced chemical vapor deposition (PECVD) method, a silicon containing dielectric layer, wherein when forming the silicon containing dielectric layer while employing the plasma enhanced chemical vapor deposition (PECVD) method there is controlled a temperature of the substrate so that there is enhanced a line-to-line capacitance uniformity of the patterned conductor layer.

The present invention provides a method for forming within a microelectronic fabrication a dielectric layer with enhanced uniformity of electrical properties. The present invention realizes the foregoing object by employing when forming through a plasma enhanced chemical vapor deposition (PECVD) method a silicon containing dielectric layer upon a patterned conductor layer formed over a substrate employed within a microelectronic fabrication a temperature control of the substrate such that a line-to-line capacitance of the patterned conductor layer is provided with enhanced uniformity.

The method may be employed where the dielectric layer is a low dielectric constant dielectric layer formed employing a fluorosilicate glass (FSG) low dielectric constant dielectric material. The method of the present invention does not ostensibly discriminate with respect to the nature of a silicon containing dielectric material which may be employed for forming a silicon containing dielectric layer while employing the plasma enhanced chemical vapor deposition (PECVD) method of the present invention. Thus, the method of the present invention may be employed for forming with enhanced line-to-line capacitance uniformity silicon containing dielectric layers including but not limited to silicon oxide dielectric layers, silicon nitride dielectric layers, silicon oxynitride dielectric layers and fluorosilicate glass (FSG) low dielectric constant dielectric layers.

The method of the present invention is readily commercially implemented. The present invention employs methods and materials as are otherwise generally known in the art of microelectronics fabrication. Since it is a process control which at least in part provides the present invention, rather than the existence of methods and materials which provides the present invention, the method of the present invention is readily commercially implemented.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The present invention provides a method for forming within a microelectronic fabrication a dielectric layer with uniform electrical properties. The present invention realizes the foregoing object by employing when forming through a plasma enhanced chemical vapor deposition (PECVD) method a silicon containing dielectric layer upon a patterned conductor layer formed over a substrate employed within a microelectronic fabrication a temperature control of the substrate such that a line-to-line capacitance of the patterned conductor layer is provided with enhanced uniformity.

The method of the present invention may be employed for forming with enhanced line-to-line capacitance uniformity upon patterned conductor layers within microelectronic fabrications silicon containing dielectric layers including but not limited to silicon oxide dielectric layers (including doped silicon oxide dielectric layers such as but not limited to borosilicate glass (BSG) doped silicon oxide dielectric layers, phosphosilicate glass (PSG) doped silicon oxide dielectric layers and borophosphosilicate glass (BPSG) doped silicon oxide dielectric layers), silicon nitride dielectric layers, silicon oxynitride dielectric layers and fluorosilicate glass (FSG) low dielectric constant dielectric layers.

Similarly, the method of the present invention may be employed for forming with enhanced line-to-line capacitance uniformity upon patterned conductor layers silicon containing dielectric layers employed within microelectronic fabrications including but not limited to integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

Figure 1:
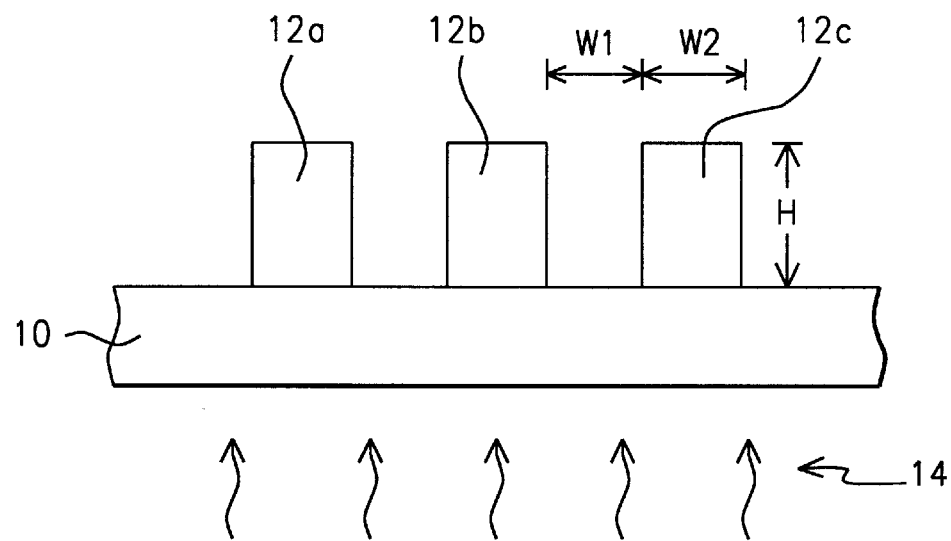
FIG. 1 and FIG. 2 show a pair of schematic cross-sectional diagrams illustrating the results of forming, in accord with a preferred embodiment of the present invention, a silicon containing dielectric layer within a microelectronic fabrication.
Figure 2:
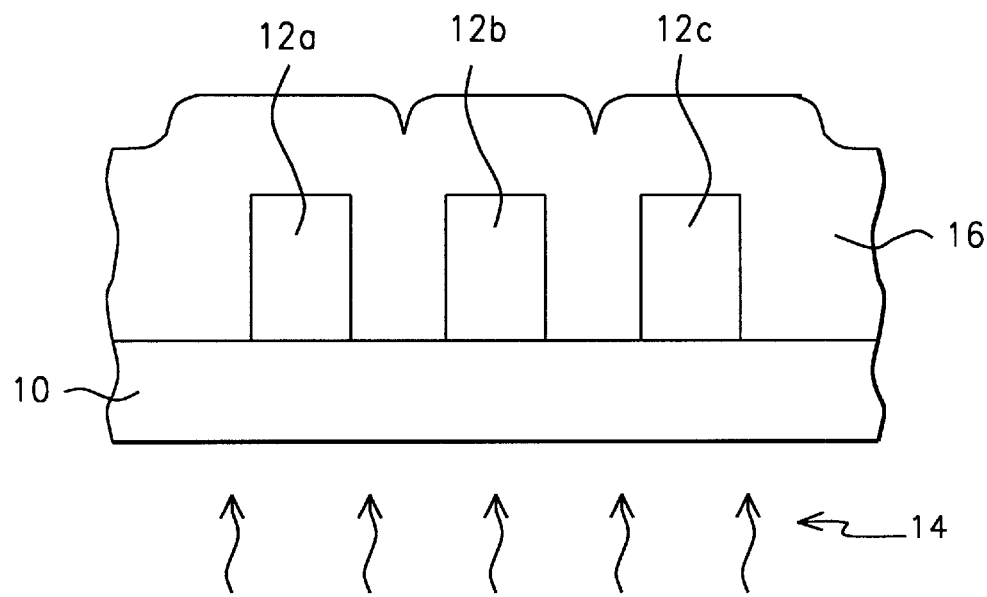

Referring now to FIG. 1 to FIG. 2, there is show a pair of schematic cross-sectional diagram illustrating the results of progressive stages in forming within a microelectronic fabrication in accord with a preferred embodiment of the present invention a silicon containing dielectric layer. Shown in FIG. 1 is a schematic cross-sectional diagram of the microelectronic fabrication at an early stage in its fabrication in accord with the preferred embodiment of the method of the present invention.

Shown in FIG. 1 is a substrate 10 having formed thereupon a series of patterned conductor layers 12a, 12b and 12c.

Within the preferred embodiment of the present invention with respect to the substrate 10, the substrate 10 may be employed within a microelectronic fabrication selected from the group including but not limited to integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

Although not specifically illustrated within the schematic cross-sectional diagram of FIG. 1, the substrate 10 may be the substrate itself as employed within the microelectronic fabrication, or in the alternative, the substrate 10 may be the substrate as employed within the microelectronic fabrication, where the substrate has formed thereupon or thereover, and thus has incorporated therein, any of several additional microelectronic layers as are commonly employed within the microelectronic fabrication within which is employed the substrate 10. Such additional microelectronic layers may include, but are not limited to, microelectronic conductor layers, microelectronic semiconductor layers and microelectronic dielectric layers.

Similarly, although also not specifically illustrated within the schematic cross-sectional diagram of FIG. 1, the substrate 10, particularly when the substrate 10 is a semiconductor substrate employed within a semiconductor integrated circuit microelectronic fabrication, typically and preferably has formed therein and/or thereupon microelectronic devices, such as semiconductor integrated circuit microelectronic devices, as are common within a microelectronic fabrication within which is employed the substrate 10. Such microelectronic devices may include, but are not limited to, transistors, resistors, diodes and capacitors.

Although not a requirement of the present invention, it is most common within the preferred embodiment of the present invention that at least the top surface of the substrate 10 will be formed of or a microelectronic dielectric material.

Within the preferred embodiment of the present invention with respect to the series of patterned conductor layers 12a, 12b and 12c, the series of patterned layers 12a, 12b and 12c may be formed from conductor materials as are conventional in the art of microelectronic fabrication, such conductor materials including but not limited to metal conductor materials, metal alloy conductor materials, highly doped polysilicon conductor materials (i.e. polysilicon having an electrically active dopant concentration of at least about 1E20 atoms per cubic centimeter) and polycide conductor materials (i.e. highly doped polysilicon/metal silicide stack conductor materials). As is illustrated within the schematic cross-sectional diagram of FIG. 1, each patterned conductor layer 12a, 12b or 12c within the series of patterned conductor layers 12a, 12b and 12c typically and preferably has a linewidth W2 of from about 0.15 to about 10 microns upon the substrate 10, while each patterned conductor layer 12a, 12b or 12c within the series of patterned conductor layers 12a, 12b and 12c simultaneously has a pitch W1 of from about 0.3 to about 20 microns separating it from an adjoining patterned conductor layer 12a, 12b or 12c within the series of patterned conductor layers 12a, 12b and 12c. Similarly, each of the patterned conductor layers 12a, 12b and 12c also has a thickness H of from about 3000 to about 15000 angstroms upon the substrate 10, as is also illustrated within the schematic cross-sectional diagram of FIG. 1.

Finally, there is illustrated within FIG. 1 a thermal control 14 which controls a temperature of the substrate 10 when subsequently forming upon the microelectronics fabrication whose schematic cross-sectional diagram is illustrated within FIG. 1 a silicon containing dielectric layer while employing a plasma enhanced chemical vapor deposition (PECVD) method. Such thermal control 14 is typically and preferably effected, at least in part, by employing a thermally conductive and refrigerated chuck when positioning the substrate 10 within a plasma reactor chamber within which is formed the silicon containing dielectric layer upon the substrate 10 whose schematic cross-sectional diagram is illustrated in FIG. 1 while employing the plasma enhanced chemical vapor deposition (PECVD) method. Alternatively, there may also be employed for thermal control of the substrate 10 when forming upon the substrate 10 the silicon containing dielectric layer intrinsic features such as bias power and/or radio frequency source power of a high density plasma chemical vapor deposition (HDP-CVD) method for forming the silicon containing dielectric layer upon the substrate 10 whose schematic cross-sectional diagram is illustrated within FIG. 1.

Referring now to FIG. 2, there is shown a schematic cross-sectional diagram illustrating the results of further processing of the microelectronics fabrication whose schematic cross-sectional diagram is illustrated in FIG. 1.

Shown in FIG. 2 is a schematic cross-sectional diagram of a microelectronic fabrication otherwise equivalent to the microelectronics fabrication whose schematic cross-sectional diagram is illustrated in FIG. 2, but wherein there is formed upon the microelectronic fabrication a blanket silicon containing dielectric layer 16. Within the preferred embodiment of the present invention, the blanket silicon containing dielectric layer 16 may be formed of silicon containing dielectric materials including but not limited to silicon oxide dielectric materials (including doped silicate glass silicon oxide dielectric materials as noted above), silicon nitride dielectric materials, silicon oxynitride dielectric materials and fluorosilicate glass (FSG) low dielectric constant dielectric materials. Similarly, within the preferred embodiment of the present invention, the blanket silicon containing dielectric layer 16 may be formed employing plasma enhanced chemical vapor deposition (PECVD) methods including but not limited to inductively coupled radio frequency plasma enhanced chemical vapor deposition (PECVD) methods (which employ only an inductively coupled radio frequency source power plasma activation), electron cyclotron resonance (ECR) plasma enhanced chemical vapor deposition (PECVD) methods and high density plasma chemical vapor deposition (HDP-CVD) methods (which simultaneously employ a plasma activation in conjunction with a bias sputtering when forming a silicon containing dielectric layer). The present invention does not provide value when forming silicon containing dielectric layers while employing conventional thermal chemical vapor deposition (CVD) methods for forming silicon containing dielectric layers, insofar as it is understood by a person skilled in the art that conventional thermal chemical vapor deposition (CVD) methods typically of necessity employ substrate temperatures generally in a range of from about 600 to about 800 degrees centigrade.

Within the preferred embodiment of the present invention, most preferably, the blanket silicon containing dielectric layer 16 is formed of a fluorosilicate glass (FSG) low dielectric constant dielectric material deposited employing a high density plasma chemical vapor deposition (HDP-CVD) method, where the thermal control 14 is employed to provide a substrate temperature of from about 350 to about 450 degrees centigrade, more preferably from about 380 to about 430 degrees centigrade, most preferably from about 400 to about 410 degrees centigrade. Similarly, the high density plasma chemical vapor deposition (HDP-CVD) method also employs when forming the blanket silicon containing dielectric layer 16 of the fluorosilicate glass (FSG) low dielectric constant dielectric material silane and silicon tetrafluoride as silicon source materials, oxygen as an oxidant source material, argon as a sputtering source material and silicon tetrafluoride also as a fluorine source material. Preferably, the high density plasma chemical vapor deposition (HDP-CVD) method also employs when forming the blanket silicon containing dielectric layer 16 of the fluorosilicate glass (FSG) low dielectric constant dielectric material over an eight inch diameter substrate 10: (1) a reactor chamber pressure of from about 1 to about 10 mtorr; (2) a source radio frequency power of from about 100 to about 4500 watts at a source radio frequency of 13.56 MHZ; (3) a bias sputtering power of from about 100 to about 4000 watts; (4) the substrate temperature of from about 380 to about 450 degrees centigrade, which is maintained, in conjunction with the bias sputtering power of from about 100 to about 4000 watts, by a backside helium cooling gas pressure of from about 2 to about 10 torr; (5) a silane flow of from about 20 to about 200 standard cubic centimeters per minute (sccm); (6) an oxygen flow rate of from about 20 to about 200 standard cubic centimeters per minute (sccm); (7) an argon flow rate of from about 20 to about 200 standard cubic centimeters per minute (sccm); and (8) a silicon tetrafluoride flow rate of from about 30 to about 60 standard cubic centimeters per minute (sccm).

Preferably, the blanket silicon containing dielectric layer 16 is formed to a thickness of from about 4000 to about 24000 angstroms upon the substrate 10, including the series of patterned conductor layers 12a, 12b and 12c, to fully encapsulate the series of patterned conductor layers 12a, 12b and 12c, as illustrated within the schematic cross-sectional diagram of FIG. 2.

Upon forming the microelectronic fabrication whose schematic cross-sectional diagram is illustrated in FIG. 2, there is formed within the microelectronic fabrication upon a patterned conductor layer formed over a substrate a blanket silicon containing dielectric layer which provides enhanced line-to-line capacitance uniformity within the patterned conductor layer within the microelectronic fabrication. The present invention realizes the foregoing object by controlling when forming the blanket silicon containing dielectric layer upon the patterned conductor layer a substrate temperature such that the patterned conductor layer line-to-line capacitance uniformity is enhanced.

EXAMPLES

There was obtained three eight inch diameter (100) silicon semiconductor substrates and formed upon each silicon semiconductor substrate within the series of three silicon semiconductor substrates a silicon oxide dielectric layer deposited employing a plasma enhanced chemical vapor deposition (PECVD) method employing silane as a silicon source material and nitrous oxide as an oxidant source material. The three silicon oxide dielectric layers were formed employing conditions as are conventional in the art of microelectronics fabrication, which conditions included: (1) a reactor chamber pressure of about 2 torr; (2) a radio frequency source power of about 300 watts at a source radio frequency of 13.56 MHZ, without any bias sputtering; (3) a semiconductor substrate temperature of about 400 degrees centigrade; (4) a silane flow rate of about 150 standard cubic centimeters per minute (sccm); and (5) a nitrous oxide flow rate of about 1500 standard cubic centimeters per minute (sccm). Each of the three silicon oxide dielectric layers was formed to a thickness of about 8000 angstroms.

Upon each of the three silicon oxide dielectric layers so formed was formed a series of parallel patterned conductor lines (which formed a patterned conductor layer) formed of an aluminum copper alloy conductor material. Each series of parallel patterned conductor lines was formed to a thickness of about 5000 angstroms, a linewidth of about 0.23 microns and a pitch separation width of about 0.46 microns upon a corresponding silicon oxide dielectric layer.

Upon a first of the three patterned conductor layers formed upon a first of the three blanket silicon oxide dielectric layers formed upon a first semiconductor substrate was formed a fluorosilicate glass (FSG) low dielectric constant dielectric layer formed employing a high density plasma chemical vapor deposition (HDP-CVD) method in accord with the preferred embodiment of the present invention. The high density plasma chemical vapor deposition (HDP-CVD) method employed silane as a silicon source material, oxygen as an oxidant source material, argon as a sputtering source material and silicon tetrafluoride as both a silicon source material and a fluorine source material. The high density plasma chemical vapor deposition (HDP-CVD) method also employed: (1) a reactor chamber pressure of about 6 mtorr; (2) a radio frequency source power of about 4400 watts at a source radio frequency of 13.56 MHZ; (3) a bias sputtering power of about 2500 watts; (4) a backside helium pressure of 4 torr which maintained the first semiconductor substrate temperature of about 410 degrees centigrade; (5) a silane flow rate of about 40 standard cubic centimeters per minute (sccm); (6) an oxygen flow rate of about 150 standard cubic centimeters per minute (sccm); (7) an argon flow rate of about 60 standard cubic centimeters per minute (sccm); and (8) a silicon tetrafluoride flow rate of about 60 standard cubic centimeters per minute (sccm).

Upon a second of the three patterned conductor layers formed upon a second of the three silicon oxide dielectric layers formed upon a second of the three semiconductor substrates was formed an undoped silicate glass (USG) (i.e. silicon oxide) layer employing materials and deposition conditions equivalent to the materials and deposition conditions employed for forming the fluorosilicate glass (FSG) low dielectric constant dielectric layer over the first of the three semiconductor substrates, but where there was not employed a flow of the silicon tetrafluoride fluorine source material.

Upon a third of the three patterned conductor layers formed upon a third of the three silicon oxide dielectric layers formed upon a third of the three semiconductor substrates was formed a fluorosilicate glass (FSG) low dielectric constant dielectric layer as is more conventional in the art of microelectronic fabrication. The fluorosilicate glass (FSG) low dielectric constant dielectric layer was formed employing materials and process conditions otherwise equivalent to the materials and process conditions employed for forming the fluorosilicate glass (FSG) low dielectric constant dielectric layer upon the first of the three patterned conductor layers formed upon the first of the three silicon oxide dielectric layers formed upon the first of the three silicon semiconductor substrates, but wherein the silicon semiconductor substrate temperature was about 450 degrees centigrade as controlled by a backside helium pressure of about 2.5 torr.

Each of the two fluorosilicate glass (FSG) low dielectric constant dielectric layers and the undoped silicate glass (USG) dielectric layer were then chemical mechanical polish (CMP) planarized without exposing each of the three series of patterned conductor lines within the three patterned conductor layers.

There was then measured the line-to-line capacitances of adjoining lines within the three patterned conductor layers while employing electrical measurement methods as are conventional in the art of microelectronics fabrication. The data so obtained for each individual patterned conductor layer was plotted as cumulative percentage versus line-to-line capacitance, as illustrated within FIG. 3.

Figure 3:
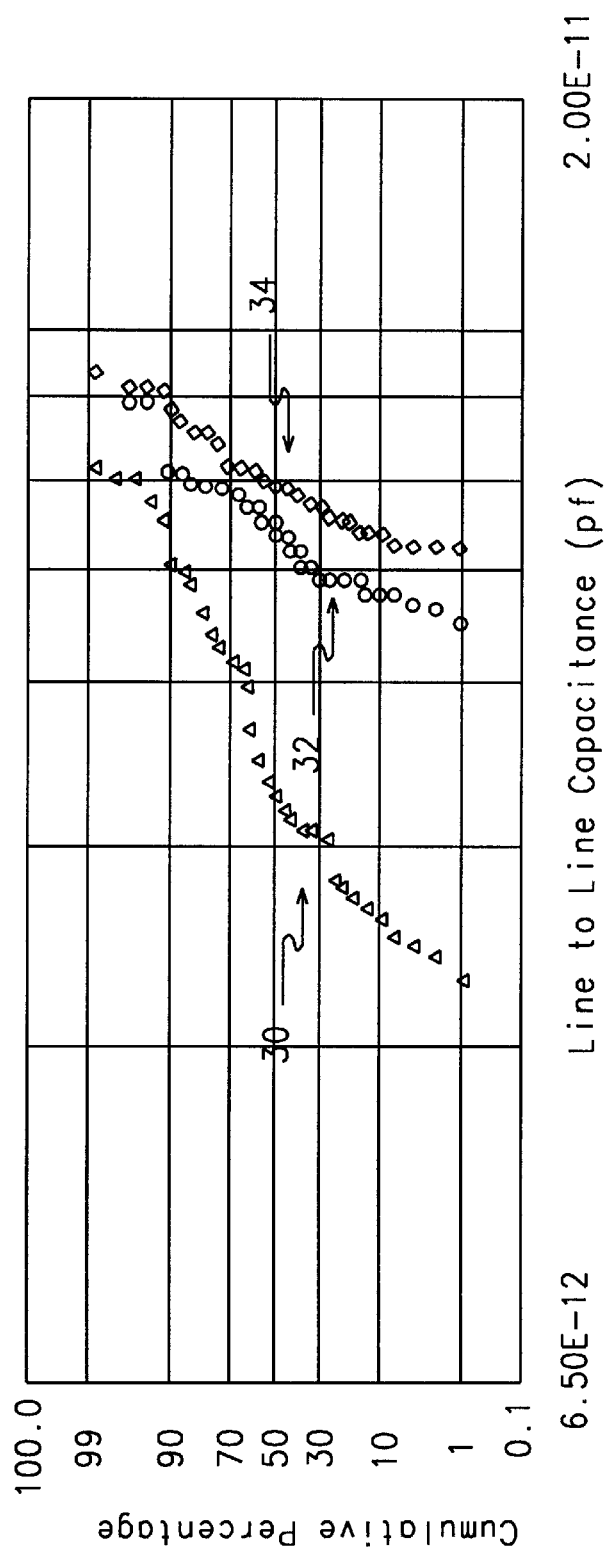
FIG. 3 shows a plot of Cumulative Percentage versus Line-to-Line Capacitance for a series of silicon containing dielectric layers formed upon a series of patterned conductor layers formed over a series of semiconductor substrates in accord with the examples of the present invention.

As shown within FIG. 3, the data points corresponding with reference number 30 correspond with the fluorosilicate glass (FSG) low dielectric constant dielectric layer formed over the third silicon semiconductor substrate at the silicon semiconductor substrate temperature of about 450 degrees centigrade corresponding with the backside helium pressure of about 2.5 torr. Similarly, the data points corresponding with reference number 32 correspond with the fluorosilicate glass (FSG) low dielectric constant dielectric layer formed in accord with the preferred embodiment of the present invention upon the first silicon semiconductor substrate at the semiconductor substrate temperature of about 410 degrees centigrade corresponding with the backside helium pressure of about 4 torr. Finally, the data points corresponding with reference numeral 34 correspond with the undoped silicate glass (USG) (i.e. silicon oxide) dielectric layer formed upon the second silicon semiconductor substrate at the silicon semiconductor substrate temperature of about 410 degrees centigrade corresponding with the backside helium pressure of about 4 torr.

Within FIG. 3, a more vertical character of a line approximating a pertinent series of data points is indicative of a greater uniformity of values for the data points within the series of data points. Thus, as is clearly seen within the series of data points of FIG. 3, there is observed an enhanced line-to-line capacitance uniformity for a fluorosilicate glass (FSG) low dielectric constant dielectric layer formed employing the method of the present invention upon a silicon semiconductor substrate having a silicon semiconductor substrate temperature of about 410 degrees centigrade than a corresponding fluorosilicate glass (FSG) layer formed employing a method otherwise equivalent to the method of the present invention, but employing a silicon semiconductor substrate temperature of about 450 degrees centigrade rather than about 410 degrees centigrade.

As is understood by a person skilled in the art, the preferred embodiment and examples of the present invention are illustrative of the present invention rather than limiting of the present invention. Revisions and modifications may be made to methods, materials, structures and dimensions employed for forming a silicon containing dielectric layer in accord with the preferred embodiment and examples of the present invention while still providing a silicon containing dielectric layer in accord with the present invention, as defined by the appended claims.

What is claimed is:

1. A method for forming a dielectric layer comprising:
   providing a substrate;
   forming over the substrate a patterned conductor layer;
   forming upon the patterned conductor layer, while employing a plasma enhanced chemical vapor deposition (PECVD), a silicon containing dielectric layer, wherein when forming the silicon containing dielectric layer there is controlled a temperature of the substrate by use of a backside cooling gas pressure so that there is enhanced a line-to-line capacitance uniformity of the patterned conductor layer.

2. The method of claim 1 wherein the substrate is employed within a microelectronic fabrication selected from the group consisting of integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

3. The method of claim 1 wherein the patterned conductor layer is selected from the group consisting of patterned conductor metal layers, patterned conductor metal alloy layers, patterned conductor polysilicon layers and patterned conductor polycide layers.

4. The method of claim 1 wherein the patterned conductor layer is formed to a thickness of from about 3000 to about 15000 angstroms.

5. The method of claim 1 wherein the plasma enhanced chemical vapor deposition (PECVD) method is selected from the group consisting of inductively coupled radio frequency plasma enhanced chemical vapor deposition (PECVD) methods, electron cyclotron resonance (ECR) plasma enhanced chemical vapor deposition (PECVD) methods and high density plasma chemical vapor deposition (HDP-CVD) methods.

6. The method of claim 1 wherein the silicon containing dielectric layer is selected from the group consisting of silicon oxide dielectric layers, silicon nitride dielectric layers, silicon oxynitride dielectric layers and fluorosilicate glass (FSG) dielectric layers.

7. The method of claim 1 wherein the silicon containing dielectric layer is formed to a thickness of from about 4000 to about 24000 angstroms.

8. The method of claim 1 wherein the temperature is controlled within a range of from about 350 to about 450 degrees centigrade.

9. The method of claim 1, wherein the backside cooling gas is comprised of helium.

10. The method of claim 1, wherein the backside cooling gas pressure is from about 2 to 10 torr.

11. The method of claim 1, wherein the backside cooling gas pressure is from about 2 to 10 torr; the temperature of the substrate is from about 380 to 450° C.; and the silicon containing dielectric layer is comprised of FSG.

12. The method of claim 1, wherein the backside cooling gas pressure is about 4 torr; the temperature of the substrate is about 410° C.; and the silicon containing dielectric layer is comprised of FSG.

13. The method of claim 1, wherein formation of the PECVD silicon containing layer is achieved at a bias sputtering power of from about 100 to 4000 watts.

14. A method for forming a dielectric layer comprising:

providing a semiconductor substrate;

forming over the semiconductor substrate a patterned conductor layer;

forming upon the patterned conductor layer, while employing a plasma enhanced chemical vapor deposition (PECVD), a silicon containing dielectric layer, wherein when forming the silicon containing dielectric layer there is controlled a temperature of the substrate by use of a backside cooling gas pressure so that there is enhanced a line-to-line capacitance uniformity of the patterned conductor layer.

15. The method of claim 14 wherein the patterned conductor layer is selected from the group consisting of patterned conductor metal layers, patterned conductor metal alloy layers, patterned conductor polysilicon layers and patterned conductor polycide layers.

16. The method of claim 14 wherein the patterned conductor layer is formed to a thickness of from about 3000 to about 15000 angstroms.

17. The method of claim 14 wherein the plasma enhanced chemical vapor deposition (PECVD) method is selected from the group consisting of inductively coupled radio frequency plasma enhanced chemical vapor deposition (PECVD) methods, electron cyclotron resonance (ECR) plasma enhanced chemical vapor deposition (PECVD) methods and high density plasma chemical vapor deposition (HDP-CVD) methods.

18. The method of claim 14 wherein the silicon containing dielectric layer is selected from the group consisting of silicon oxide dielectric layers, silicon nitride dielectric layers, silicon oxynitride dielectric layers and fluorosilicate glass (FSG) dielectric layers.

19. The method of claim 14 wherein the silicon containing dielectric layer is formed to a thickness of from about 4000 to about 24000 angstroms.

20. The method of claim 14 wherein the temperature is controlled within a range of from about 350 to about 450 degrees centigrade.

21. The method of claim 14, wherein the backside cooling gas is comprised of helium.

22. The method of claim 14, wherein the backside helium cooling gas pressure is from about 2 to 10 torr.

23. The method of claim 14, wherein the backside helium cooling gas pressure is from about 2 to 10 torr; the temperature of the substrate is from about 380 to 450° C.; and the silicon containing dielectric layer is comprised of FSG.

24. The method of claim 14, wherein the backside helium cooling gas pressure is about 4 torr; the temperature of the substrate is about 410° C.; and the silicon containing dielectric layer is comprised of FSG.

25. The method of claim 14, wherein formation of the PECVD silicon containing layer is achieved at a bias sputtering power of from about 100 to 4000 watts.

* * * * *